United States Patent
Nakamura et al.

(10) Patent No.: US 7,909,949 B2
(45) Date of Patent: Mar. 22, 2011

(54) SPUTTERING TARGET WITH FEW SURFACE DEFECTS, AND SURFACE PROCESSING METHOD THEREOF

(75) Inventors: Yuichiro Nakamura, Ibaraki (JP); Akira Hisano, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 351 days.

(21) Appl. No.: 10/598,502

(22) PCT Filed: Feb. 15, 2005

(86) PCT No.: PCT/JP2005/002209
§ 371 (c)(1), (2), (4) Date: Sep. 1, 2006

(87) PCT Pub. No.: WO2005/083148
PCT Pub. Date: Sep. 9, 2005

(65) Prior Publication Data
US 2007/0125645 A1 Jun. 7, 2007

(30) Foreign Application Priority Data
Mar. 1, 2004 (JP) .................. 2004-055989

(51) Int. Cl.
*C22F 1/16* (2006.01)
*C22C 19/07* (2006.01)

(52) U.S. Cl. .................. 148/557; 148/425; 204/298.13; 29/527.6

(58) Field of Classification Search .................. 148/425, 148/557; 204/298.12, 298.13; 420/435, 420/436
See application file for complete search history.

(56) References Cited

U.S. PATENT DOCUMENTS

| | | | | | |
|---|---|---|---|---|---|
| 4,895,592 | A | * | 1/1990 | Hatwar et al. | 75/10.14 |
| 5,460,793 | A | * | 10/1995 | Kano et al. | 423/344 |
| 6,024,852 | A | * | 2/2000 | Tamura et al. | 204/298.12 |
| 6,153,315 | A | * | 11/2000 | Yamakoshi et al. | 428/687 |
| 6,521,062 | B1 | * | 2/2003 | Bartholomeusz et al. | 148/674 |
| 2007/0187236 | A1 | * | 8/2007 | Nakamura et al. | 204/298.12 |
| 2007/0215463 | A1 | * | 9/2007 | Parkhe | 204/298.12 |

FOREIGN PATENT DOCUMENTS

| | | |
|---|---|---|
| JP | 06-136524 | 5/1994 |
| JP | 09-228037 | 9/1997 |
| JP | 11-293454 | 10/1999 |
| JP | 2000-199054 A | 7/2000 |
| JP | 2002-069623 | * 3/2002 |
| JP | 2002-208125 | * 7/2002 |

OTHER PUBLICATIONS

English translation of Ueno JP 2002-069623, published Mar. 8, 2002, 26 pages total.*
English translation of Ueno JP 2002-208125, published Jul. 28, 2002, 23 pages total.*
Esp@cenet database, one page English Abstract of JP 03-257158, Nov. 1991.

* cited by examiner

*Primary Examiner* — George Wyszomierski
*Assistant Examiner* — Mark L Shevin
(74) *Attorney, Agent, or Firm* — Howson & Howson LLP

(57) ABSTRACT

Provided is a surface processing method of a sputtering target, wherein a target surface in which intermetallic compounds, oxides, carbides, carbonitrides and other substances without ductility exist in a highly ductile matrix phase at a volume ratio of 1 to 50% is preliminarily subject to the primary processing of cutting work, then subsequently subject to finish processing via polishing. The sputtering target subject to this surface processing method is able to improve the target surface having numerous substances without ductility, and prevent or suppress the generation of nodules and particles upon sputtering.

3 Claims, No Drawings

SPUTTERING TARGET WITH FEW SURFACE DEFECTS, AND SURFACE PROCESSING METHOD THEREOF

BACKGROUND OF THE INVENTION

The present invention relates to a sputtering target with few surface defects such as cracks, indentations, fallouts and the like on the target surface, and to the surface processing method thereof.

The sputtering method is a well-known technique as a means for forming a thin film. The basic principle thereof is to apply voltage between a substrate (anode side) to which the thin film is to be formed and a target (cathode side) facing the substrate at a close distance and which is formed from a thin film forming substance, so as to change argon gas into a plasma. As a result, the argon ion generated thereby collides with the target, which is a cathode material, the energy thereof discharges (knocks out) the target material outside, and the discharged material is laminated on the opposed substrate face.

A thin film forming device employing this sputtering principle includes various modified types such as a bipolar bias sputtering device, high frequency sputtering device, plasma sputtering device and so on, but all of these devices employ the same basic principle.

The material for forming the thin film is referred to as a target, since it becomes the target of the argon ion. Since this target is formed from the collision energy of ion, the thin film forming material constituting the target is laminated on the substrate in an atomic form, or a cluster form formed from an aggregate of such atoms. As a result, a fine and accurate thin film can be formed, and this is the reason it is being widely used in various electronic components today.

Recently, this sputtering used for forming thin films is being demanded of extremely sophisticated deposition methods, and an important task is to form films with few defects.

The generation of such defects in this sputtering is not only attributable to the sputtering method, but is also often caused by the target itself. As such a cause of the generation of defects resulting from the target, there is the production of particles and nodules.

Under normal conditions, the material sputtered (discharged) from the target will adhere to the opposed substrate, but the material is not necessarily sputtered perpendicularly, and is discharged in various directions. This kind of discharged material will adhere to the components inside the sputtering device other than the substrate, and this at some point will peel off, float, and reattach to the substrate.

This kind of material is referred to as particles, and this is not an originally scheduled thin film forming material. Further, since such particles often adhere as a large cluster, for instance, these particles will cause a short circuit in the fine wiring film of electronic components, and lead to the generation of defective products. In the generation of such particles, it has been discovered that the generation of particles will increase or decrease depending on the degree of materials discharged from the target; that is, the surface condition of the target.

Further, generally speaking, the target face material is not reduced (eroded) evenly due to the sputtering, and the tendency is for a specific area, a ring shape for example, to be eroded depending on the inherent characteristics of the constituent material and sputtering device, method of applying voltage, among other reasons. Moreover, depending on the type of target material or the manufacturing method of the target, a protrusive substance with numerous bumps known as nodules is formed on the target.

Since this is one of the thin film forming materials, it will not directly affect the thin film. Nevertheless, minute arcs (microarcing) will occur to the protrusions of the nodules, and it has been observed that this results in the increase of particles.

Further, when numerous nodules are generated, the sputtering rate will change (become delayed), and it will not be possible to control the deposition. At times, these rough and large nodules will peel off and adhere to the substrate.

In such a case, the nodules themselves will become a significant obstacle. Thus, it is sometimes necessary to temporarily stop the sputtering process to remove the nodules. This results in a problem of deteriorating the operation efficiency.

Recently, a target is not formed from a uniform material, and is often used in a state where intermetallic compounds, oxides, carbides, carbonitrides and other substances are mixed in a ductile matrix phase. Here, there is a problem in that the generation of nodules and particles will increase.

As conventional technology, disclosed is a sputtering target in which the processing defect layer (fracture layer) containing minute cracks and defective parts arising during the machine work is removed from the surface of a high-melting point metal alloy sputtering target (c.f. Patent Document 1); and a technique for uniformizing the film and suppressing the generation of nodules and particles by adjusting the surface roughness of the sputtering target so as to reduce the amount of residual contamination, hydrogen content on the surface, and thickness of the affected layer (c.f. Patent Document 2).

Nevertheless, these techniques are not able to resolve the problems encountered in a sputtering target comprising a phase with different fragility.

[Patent Document 1]
Gazette of Japanese Patent Laid-Open Publication No. H3-257158

[Patent Document 2]
Gazette of Japanese Patent Laid-Open Publication No. H 11-1766

SUMMARY OF THE INVENTION

Accordingly, an object of the present invention is to provide a sputtering target with few surface defects that is able to improve the target surface in which intermetallic compound, oxide, carbide, carbonitride and other substances without ductility exist in a highly ductile matrix phase, and prevent or suppress the generation of nodules and particles upon sputtering, and to provide the surface processing method thereof.

The present invention provides: (1) a sputtering target with few surface defects having a target surface in which intermetallic compounds, oxides, carbides, carbonitrides and other substances without ductility exist in a highly ductile matrix phase at a volume ratio of 1 to 50%, wherein defects of 10 µm or more resulting from machine work do not exist; (2) a sputtering target according (1) above, wherein intermetallic compounds, oxides, carbides, carbonitrides and other substances without ductility exist in a highly ductile matrix phase at a size in which the average particle diameter is at least 0.5 to 50 µm; and (3) a sputtering target according to (1) or (2) above, wherein the Vickers hardness of the highly ductile matrix phase is 400 or less, the Vickers hardness of the intermetallic compounds, oxides, carbides, carbonitrides and other substances without ductility is 400 or more, and the hardness difference thereof is at least 1.5 times.

Further, the present invention also provides: (4) a surface processing method of a sputtering target with few surface defects, wherein a target surface in which intermetallic compounds, oxides, carbides, carbonitrides and other substances without ductility exist in a highly ductile matrix phase at a volume ratio of 1 to 50% is preliminarily subject to the primary processing of cutting work, then subsequently subject to finish processing via polishing; (5) a surface processing method of a sputtering target according to (4) above, wherein the primary processing of cutting work is performed to cut an area of 1 mm to 10 mm from the surface of the target material; (6) a surface processing method of a sputtering target according to (4) or (5) above, wherein the finish processing via polishing is performed to polish an area of 1 μm to 50 μm from the surface after being subject to the primary processing of cutting work; (7) a surface processing method of a sputtering target according to any one of (4) to (6) above, wherein polishing is performed with sandpaper or a grindstone having a rough abrasive grain size of #80 to #400; (8) a surface processing method of a sputtering target according to any one of (4) to (7) above, wherein cutting is performed with lathe processing employing a bite (a cutting tool) or a chip; (9) a surface processing method of a sputtering target according to any one of (4) to (8), wherein intermetallic compounds, oxides, carbides, carbonitrides and other substances without ductility exist in a highly ductile matrix phase at a size in which the average particle diameter is at least 0.5 to 50 μm; and (10) a surface processing method of a sputtering target according to any one of (4) to (9), wherein the Vickers hardness of the highly ductile matrix phase is 400 or less, the Vickers hardness of the intermetallic compounds, oxides, carbides, carbonitrides and other substances without ductility is 400 or more, and the hardness difference thereof is at least 1.5 times.

DETAILED DESCRIPTION OF THE INVENTION

The target subject to the surface processing of the present invention is a target in which intermetallic compounds, oxides, carbides, carbonitrides and other substances without ductility are mixed in a highly ductile matrix phase at a volume ratio of 1 to 50%.

When this kind of target material with substances without ductility being mixed therein is subject to cutting work with a bite (a cutting tool), for example, with the location where intermetallic compounds, oxides, carbides, carbonitrides and other substances without ductility exist as the point of origin, defects (dents) in the form of cracks, indentations caused by fallouts, or in some cases fragments remaining in the indentation will be formed.

This kind of surface defect often occurs even when the material without ductility having an average particle diameter of 0.5 to 50 μm or more is evenly and finely dispersed. Further, when the hardness thereof is measured, it often seems to be that the Vickers hardness of the highly ductile matrix phase is 400 or less, the Vickers hardness of the intermetallic compounds, oxides, carbides, carbonitrides and other substances without ductility is 400 or more, and the hardness difference is 1.5 times.

Therefore, in such a case, the surface processing method of the present invention is particularly effective.

In the present invention, after performing the primary processing of cutting an area of preferably 1 mm to 10 mm from the target material, the finishing processing via polishing is subsequently performed. The reason for cutting an area of 1 mm to 10 mm is to effectively remove the defects previously formed thereon. It is desirable to perform cutting via lathe processing employing a bite (a cutting tool) or a chip.

As a result of this cutting processing (primary processing), although the generation of defects such as cracks and indentations caused by fallouts as described above will occur, such defects are polished with sandpaper or a grindstone having a rough grain size of, for instance, #80 to #400. Thereby, the foregoing defects such as cracks and indentations caused by fallouts are eliminated, and a flat and smooth target face is formed thereby.

Sandpaper or a grindstone having a rough grain size of #80 to #400 is able to effectively eliminate the defects originating from intermetallic compounds, oxides, carbides, carbonitrides and other substances without ductility generated from the cutting work, and is the optimum range of preparing a flat and smooth surface including a ductile matrix phase. Here, there is no need to perform mirror polishing, and it will suffice so long as the fallout of cracks and indentations can be removed.

When preparing a flat and smooth target without surface defects such as cracks and indentations caused by fallouts, it is possible to consider polishing the target material from the start with sandpaper or a grindstone having a rough grain size of #80 to #400. Nevertheless, in such a case, there is a problem in that the amount of time required for polishing processing will be enormous, and the maintenance frequency of the grindstone will increase due to the substance of a highly ductile matrix adhering to the grindstone.

In addition, particularly with manual polishing processing, although there may not be a significant difference in the surface roughness, there is a tendency that the outer periphery and center portion are polished more, and there is a problem in that an undulation will occur on the target surface. Therefore, in reality, it is impossible to only perform polishing processing, without performing grinding processing, for the surface processing of the target.

With the sputtering target of the present invention obtained by preliminarily performing primary processing of cutting work to the target surface and thereafter performing finish processing via polishing, as shown in the Examples described below, a significant effect is yielded in that defects of 10 μm or more are eliminated, the surface roughness is improved, and the generation of particles and the generation of nodules after the use of the target can be significantly reduced.

EXAMPLES

Next, the Examples of the present invention are explained. These Examples are merely illustrative, and the present invention shall not in any way be limited by such Examples.

Example 1

In Example 1, Co, Cr, Pt, B were used as the raw material, a target manufactured under the manufacturing conditions including melting, casting and rolling was used, primary processing of cutting with a lathe was performed, and polishing processing with #280 sandpaper was subsequently performed for 10 minutes.

Next, this target was used to form a sputter film on a substrate under an Ar atmosphere of 1.5 Pa and DC sputtering condition of 30 w/cm$^2$.

The defect density of 10 μm or more, average surface roughness, quantity of nodules after use, quantity of particles and surface processing conditions in the foregoing case are shown in Table 1.

Further, the micrographs of the surface condition of the target after being subject to grinding processing, and the surface condition of the target after being subject to polishing processing are shown in FIG. 1 and FIG. 2, respectively. In FIG. 1, defects resulting from numerous cracks and indentations caused by fallouts can be acknowledged. Nevertheless, in FIG. 2 after polishing, no surface defects can be acknowledged.

TABLE 1

| | Defect Density of 10 μm or More (Defect/cm²) | Average Surface Roughness (μm) | Quantity of Nodules after Use | Quantity of Particles | Surface Processing Method |
|---|---|---|---|---|---|
| Example 1 | 0 | 1.0 | 50 | Few | Processing Method 1 |
| Example 2 | 0 | 0.4 | 45 | Few | Processing Method 1 |
| Comparative Example 1 | 85 | 1.8 | 221 | Many | Processing Method 2 |
| Comparative Example 2 | 50 | 1.6 | 182 | Many | Processing Method 2 |
| Comparative Example 3 | 30 | 0.9 | 170 | Many | Processing Method 2 |
| Comparative Example 4 | 0 | 0.4 | 42 | Few | Processing Method 3 |

Processing Method 1: Cutting processing and polishing processing
Processing Method 2: Cutting processing only
Processing Method 3: Polishing processing only
In Comparative Example 4, the polished surface of the target was undulated.

Example 2

In Example 2, Co, Cr, Pt, B were used as the raw material, and, as with Example 1, a target manufactured under the manufacturing conditions including melting, casting and rolling was used, primary processing of cutting with a lathe was performed, and polishing processing with #400 sandpaper was subsequently performed for 30 minutes.

This target was used to perform sputtering as with Example 1, and the defect density of 10 μm or more, average surface roughness, quantity of nodules after use, quantity of particles were examined. The results are similarly shown in Table 1.

Further, the surface condition of the target after being subject to grinding processing, and the surface condition of the target after being subject to polishing processing were observed with a microscope. Defects resulting from numerous cracks and indentations caused by fallouts were acknowledged on the target surface after being subject to grinding processing. Nevertheless, with the target after being subject to polishing, as with Example 1, no surface defects were acknowledged.

Comparative Example 1

In Comparative Example 1, Co, Cr, Pt, B were used as the raw material as with Example 1, a target manufactured under the manufacturing conditions including melting, casting and rolling was used, primary processing of cutting with a lathe was performed. The amount cut in this case was 0.5 mm Polishing processing was not performed subsequently.

This target was used to perform sputtering as with Example 1, and the defect density of 10 μm or more, average surface roughness, quantity of nodules after use, quantity of particles were examined. The results are similarly shown in Table 1.

Further, the surface condition of the target after being subject to grinding processing was observed with a microscope. Defects resulting from numerous cracks and indentations caused by fallouts were acknowledged on the target surface after being subject to grinding processing, and the defect density of 10 μm or more increased. The number of nodules and particles also increased.

Comparative Example 2

In Comparative Example 2, other than the amount cut being 0.1 mm upon performing primary processing of cutting with a lathe, the conditions used were the same as Comparative Example 1. Polishing processing was not performed.

This target was used to perform sputtering as with Example 1, and the defect density of 10 μm or more, average surface roughness, quantity of nodules after use, quantity of particles were examined. The results are similarly shown in Table 1.

Further, the surface condition of the target after being subject to grinding processing was observed with a microscope. Defects resulting from numerous cracks and indentations caused by fallouts were acknowledged on the target surface after being subject to grinding processing, and the defect density of 10 μm or more increased. As shown in Table 1, the number of nodules and particles also increased.

Comparative Example 3

In Comparative Example 3, other than the amount cut being 0.05 mm upon performing primary processing of cutting with a lathe, the conditions used were the same as Comparative Example 1. Polishing processing was not performed.

This target was used to perform sputtering as with Example 1, and the defect density of 10 μm or more, average surface roughness, quantity of nodules after use, quantity of particles were examined. The results are similarly shown in Table 1.

Further, the surface condition of the target after being subject to grinding processing was observed with a microscope. Defects resulting from numerous cracks and indentations caused by fallouts were acknowledged on the target surface after being subject to grinding processing, and the defect density of 10 μm or more increased.

Since the amount cut was small compared to Comparative Examples 1 and 2, the number of defects was somewhat smaller, but it still showed a similar tendency. As shown in Table 1, the number of nodules and particles also increased.

Comparative Example 4

In Comparative Example 4, Co, Cr, Pt, B were used as the raw material as with Example 1, a target manufactured under the manufacturing conditions including melting, casting and rolling was used, and manual polishing processing was performed from the start to obtain a finish using a grindstone in the order of #80, #150, #280, #400.

Here, there was a problem in that the amount of time required to perform the polishing processing became enormous, and the maintenance frequency of the grindstone increased since the substance of a high ductility matrix adhered to the grindstone.

In addition, with manual polishing processing, although there was no significant difference in the surface roughness, the outer periphery and center portion tended to be polished more, and an undulation occurred on the target surface. The result was a defective target.

As shown in foregoing Examples 1 and 2, the defect density of 10 μm or more resulted in zero defect/cm², and has decreased significantly in comparison to the Comparative Examples. Further, the average surface roughness has also improved in comparison to the Comparative Example. Moreover, it is evident that the generation of nodules and particles after the target is sputtered, which is in particular a problem upon forming thin films, has decreased considerably.

Therefore, it is evident that the surface processing method of the present invention pursuant to cutting work and polishing processing yields a significant effect in the surface processing of a target in which intermetallic compounds, oxides, carbides, carbonitrides and other substances without ductility exist in a highly ductile matrix phase at a volume ratio of 1 to 50%.

Since the present invention yields a superior effect in that it is possible to obtain a target without defects such as cracks, indentations, fallouts or the like by preliminarily subjecting a target surface to the primary processing of cutting work, then subsequently subjecting this to finish processing via polishing, and, as a result of sputtering with this target, the generation of particles and the generation of nodules after the use of the target can be significantly reduced. Thus, the present invention is particularly effective when employed in a target having a target surface in which intermetallic compounds, oxides, carbides, carbonitrides and other substances without ductility exist in a highly ductile matrix phase at a volume ratio of 1 to 50%.

With the present invention, as a result of a target surface in which intermetallic compounds, oxides, carbides, carbonitrides and other substances without ductility exist in a highly ductile matrix phase at a volume ratio of 1 to 50% being preliminarily subject to the primary processing of cutting work, then subsequently subject to finish processing via polishing, a target without defects such as cracks, indentations, fallouts or the like can be obtained. As a result of sputtering with this target, a significant effect is yielded in that defects of 10 µm or more can be substantially eliminated, the surface roughness will improve, and the generation of particles and the generation of nodules after the use of the target can be significantly reduced.

The invention claimed is:

1. A surface processing method for a sputtering target, comprising the steps of:
    preparing a target surface of a sputtering target containing at least Co, Cr, Pt and B by melting, casting and rolling in which intermetallic compounds, oxides, carbides, carbonitrides and other substances without ductility exist in a highly ductile matrix phase of said target at a volume ratio of 1 to 50%, said substances without ductility being of a size in which an average particle diameter is at least 0.5 to 50 µm, a Vickers hardness of said highly ductile matrix phase being 400 or less, a Vickers hardness of said substances without ductility being 400 or more, and a hardness difference thereof being at least 1.5 times;
    preliminarily subjecting said target to primary processing of cutting work by cutting a thickness of 1 mm to 10 mm from said target surface; and
    then subsequently finish processing said target, said finishing processing step consisting of polishing a thickness of 1 µm to 50 µm from said target surface with sandpaper or a grindstone having a rough abrasive grain size of #80 to #400 after said primary processing such that surface defects of 10 µm or more resulting from machine work do not exist.

2. A surface processing method according to claim 1, wherein said cutting is performed with lathe processing employing a cutting tool or a chip.

3. A method of processing a surface of a sputtering target, consisting of the steps of:
    melting, casting and rolling raw material containing at least Co, Cr, Pt and B to form a sputtering target having a surface with particles of intermetallic compounds, oxides, carbides, and carbonitrides existing within a highly ductile matrix phase at a volume ratio of 1 to 50%, the intermetallic compounds, oxides, carbides, and carbonitrides having an average particle diameter of at least 0.5 µm and a Vickers hardness of 400 or more, the matrix phase having a Vickers hardness of 400 or less, and a hardness difference thereof being at least 1.5 times;
    preliminarily subjecting said sputtering target to primary processing of cutting work by cutting 1 mm to 10 mm of depth from said target surface; and
    then subsequently finish processing said sputtering target via polishing 1 µm to 50 µm of depth from said surface with sandpaper or a grindstone having a rough abrasive grain size of #80 to #400 after said primary processing such that surface defects of 10 µm or more resulting from machine work do not exist and such that the target surface provides a flat and smooth target face without undulation.

* * * * *